(12) United States Patent
Starkston

(10) Patent No.: US 7,223,638 B2
(45) Date of Patent: May 29, 2007

(54) MICROELECTRONIC ASSEMBLY HAVING A THERMALLY CONDUCTIVE MEMBER WITH A CAVITY TO CONTAIN A PORTION OF A THERMAL INTERFACE MATERIAL

(75) Inventor: Robert Starkston, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/846,722

(22) Filed: May 13, 2004

(65) Prior Publication Data

US 2005/0255635 A1 Nov. 17, 2005

(51) Int. Cl.
*H01L 21/00* (2006.01)
(52) U.S. Cl. ........................ 438/122; 438/118
(58) Field of Classification Search ................ 438/121, 438/122, 438, 436, 118, 108
See application file for complete search history.

(56) References Cited

U.S. PATENT DOCUMENTS

| 6,504,242 | B1* | 1/2003 | Deppisch et al. | 257/707 |
| 2003/0134454 | A1* | 7/2003 | Houle | 438/122 |
| 2004/0238944 | A1* | 12/2004 | Bish et al. | 257/706 |
| 2005/0068739 | A1* | 3/2005 | Arvelo et al. | 361/718 |

* cited by examiner

*Primary Examiner*—S. V. Clark
(74) *Attorney, Agent, or Firm*—Blakely, Sokoloff, Taylor & Zafman LLP

(57) ABSTRACT

A thermally conductive member is placed adjacent a microelectronic die with a thermal interface material between the microelectronic die and a wetting layer formed on a surface of the thermally conductive member. The thermal interface material is heated to cause reflow thereof. The first portion of the thermal interface material is directed by the wetting layer into a first cavity formed in the thermally conductive member. The thermal interface material is then allowed to cool and solidify.

19 Claims, 8 Drawing Sheets

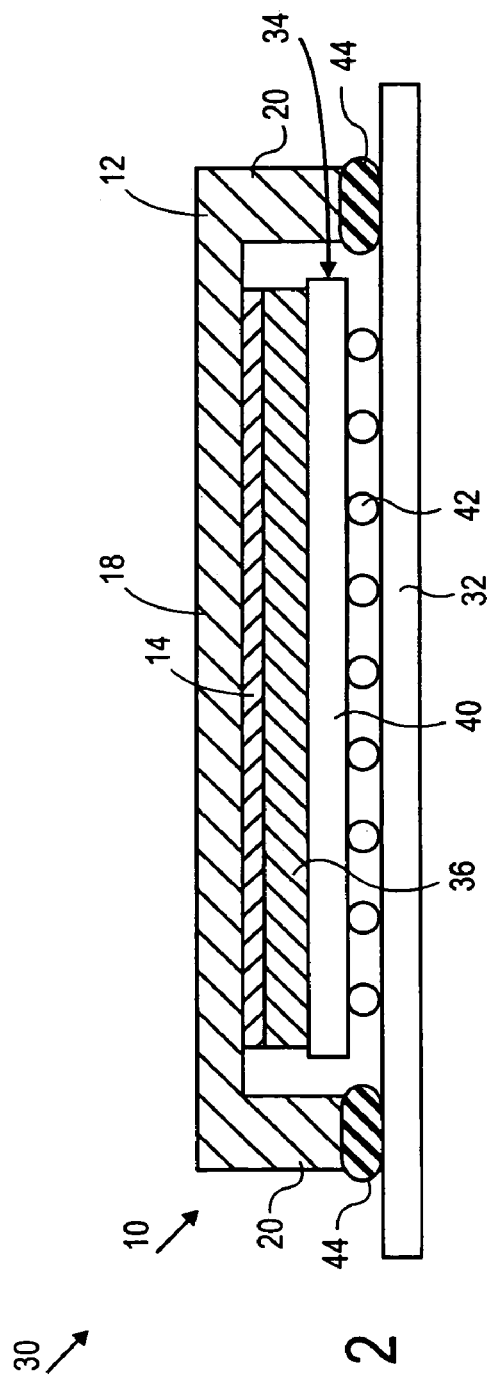
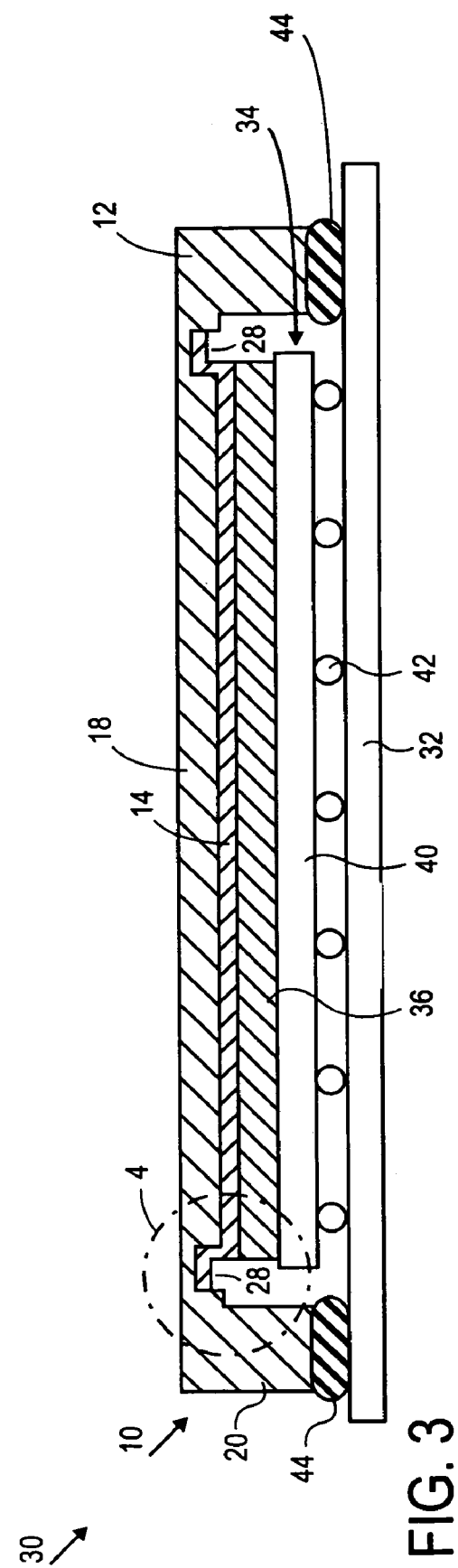

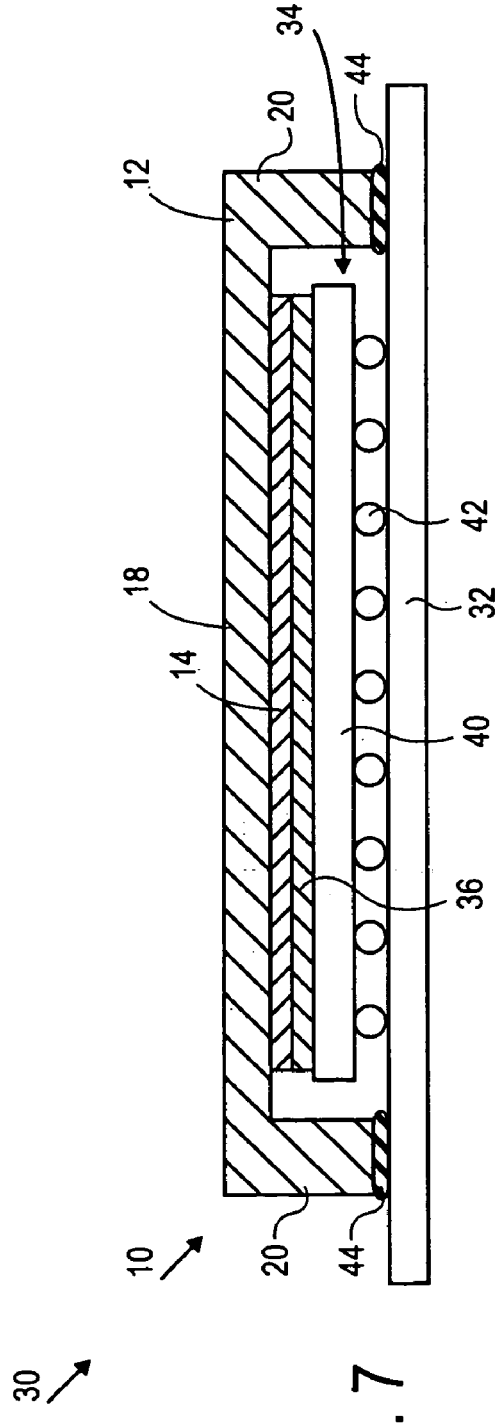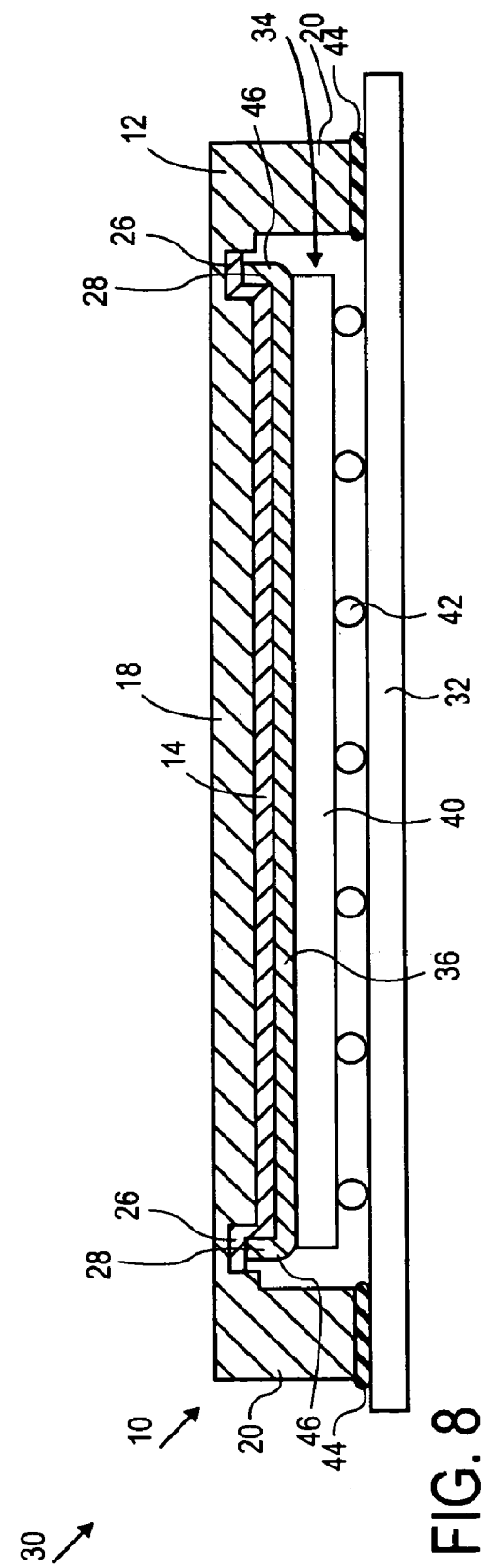

MICROELECTRONIC ASSEMBLY HAVING A THERMALLY CONDUCTIVE MEMBER WITH A CAVITY TO CONTAIN A PORTION OF A THERMAL INTERFACE MATERIAL

BACKGROUND OF THE INVENTION

1). Field of the Invention

This invention relates to a microelectronic assembly having a thermal interface material for conducting heat from a microelectronic die to a thermally conductive member, and to a method of constructing a microelectronic assembly.

2). Discussion of Related Art

Integrated circuits are usually manufactured in and on semiconductor wafers that are subsequently "diced" or "singulated" into individual dies, each die having a respective integrated circuit. A die is then mounted to a carrier substrate for providing structural integrity to the microelectronic die and for communicating signals, power, and ground to and from the integrated circuit.

Integrated circuits that consume a large amount of power also generate a large amount of heat. A thermally conductive member such as a heat spreader or a heat sink is often attached to the microelectronic die to assist in transfer of heat from the microelectronic die. A thermal interface material having a relatively low melting temperature is also located between the microelectronic die and the thermally conductive member. The thermal interface material is reflowed in an oven and subsequently allowed to cool, to cause proper attachment to the die and the thermally conductive member on opposites sides thereof.

During such a reflow process, the thermally conductive member usually drops by a small distance toward the microelectronic die. Melted portions of the thermal interface material squeeze out from a space between the microelectronic die and the thermally conductive member. Such portions that are squeezed out can reach unintended locations and, for example, create a short circuit.

BRIEF DESCRIPTION OF THE DRAWINGS

The invention is described by way of examples with reference to the accompanying drawings, wherein:

FIG. 2 is a cross-sectional side view on 2—2 in FIG. 1 of the heat spreader component of FIG. 1 and other components for constructing a microelectronic assembly according to an embodiment of the invention;

FIG. 3 is a cross-sectional view on 3—3 in FIG. 1 of the components shown in FIG. 2;

FIG. 6 is a view similar to FIG. 1 illustrating where the thermal interface material flows to;

FIG. 7 is a view similar to FIG. 2 after the thermal interface material is reflowed as shown in FIG. 5 and subsequent cooling of the reflowed thermal interface material;

FIG. 8 is a view similar to FIG. 3 of the components illustrated in FIG. 7;

DETAILED DESCRIPTION OF THE INVENTION

Figure 1:
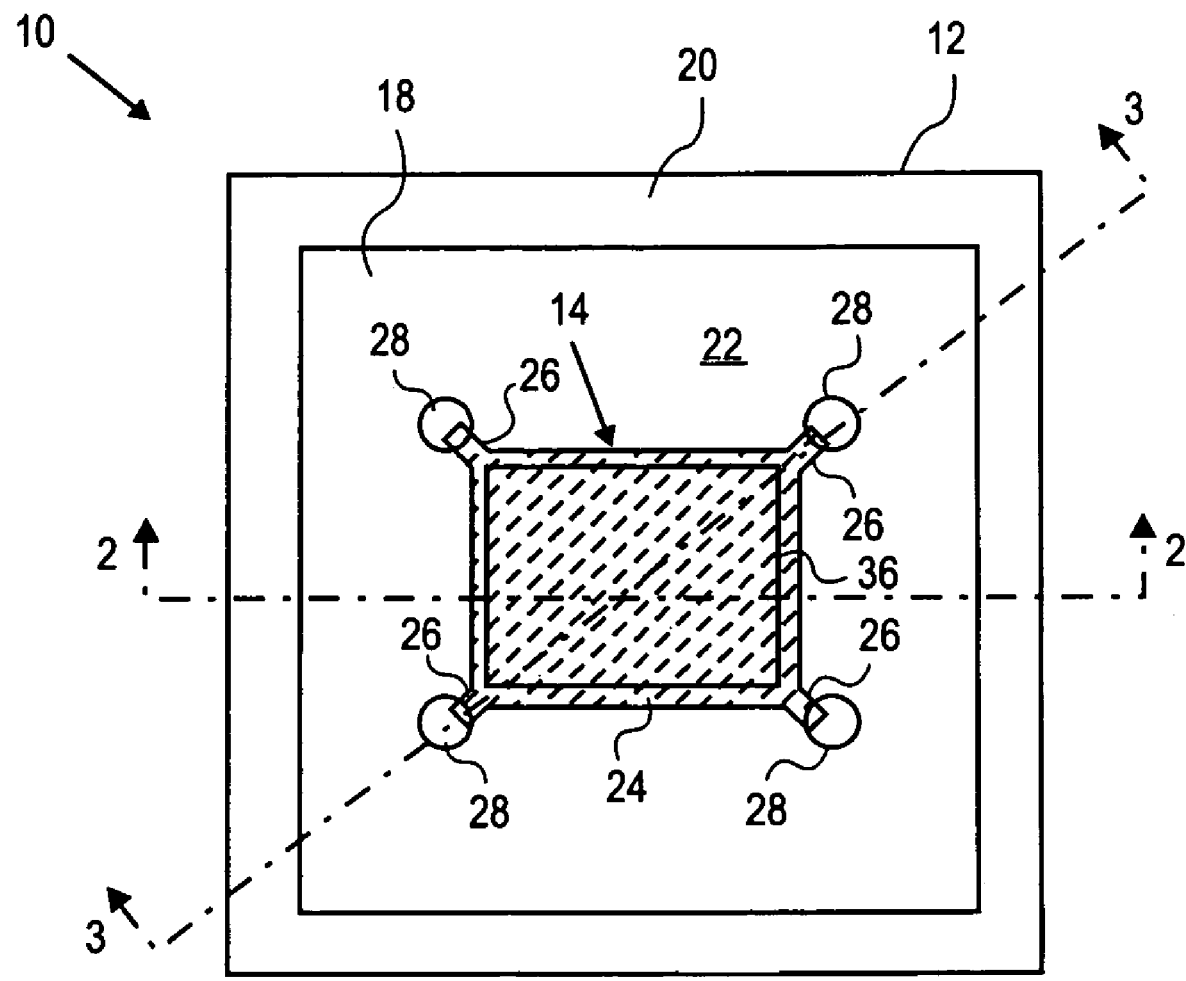
FIG. 1 is a bottom view of a heat spreader component according to an embodiment of the invention.

FIG. 1 of the accompanying drawings illustrates a heat spreader component 10 of a microelectronic assembly, including a thermally conductive member 12 and a wetting layer 14 formed on the thermally conductive member 12.

The thermally conductive member 12 has a core of copper and a nickel layer plated on the core so that outer surfaces of the thermally conductive member 12 are made of nickel. The thermally conductive member 12 has a central portion 18 and sides 20 extending from a periphery of the central portion 18 in a direction out of the paper.

The wetting layer 14 is formed on a surface 22 of the central portion 18. The wetting layer 14 has a main portion 24 having a rectangular shape and four extensions 26 leading from corners of the main portion 24. Four openings 28 are formed into the surface 22 and each extension 26 leads into a respective one of the openings 28. Each extension 26 thus connects a respective corner of the main portion 24 with a respective opening 28.

The wetting layer 14 is typically made of a noble or semi-noble material that oxidizes more slowly than the nickel of the thermally conductive member 12. The materials of the thermally conductive member 12 and wetting layer 14 preferably melt at temperatures above 1200° C. Candidate metals for the wetting layer 14 are, for example, gold, silver, and platinum.

FIGS. 2 and 3 illustrate components of the entire microelectronic assembly 30 before final manufacture, including the thermally conductive member 12, the wetting layer 14, a carrier substrate 32, a microelectronic die 34, and a thermal interface material 36.

The carrier substrate 32 is made of alternating dielectric and metal layers. The metal layers are patterned to form individual conductors. Vias may also be formed through the dielectric layers to connect individual conductors to one another. The conductors allow for routing of signals, power, and ground between upper and lower surfaces of the carrier substrate 32 and in horizontal directions.

The microelectronic die 34 includes a semiconductor, typically silicon, substrate 40, and a plurality of interconnection elements 42. An integrated circuit (not shown) is formed on a lower side of the semiconductor substrate 40. The integrated circuit includes a multitude of electronic components such as transistors, diodes, capacitors, etc. The interconnection elements 42 are typically solder bumps that are manufactured according to a known controlled collapsed chip connect (C4) process on contacts (not shown) that are formed on the semiconductor substrate 40.

The microelectronic die 34 is placed on the carrier substrate 32 so that each one of the interconnection elements 42 is in contact with a respective terminal on an upper surface of the carrier substrate 32. The combination of the carrier substrate 32 and the microelectronic die 34 is placed in a reflow oven, which melts the interconnection elements 42 so that they reflow. Subsequent cooling causes solidification of the interconnection elements 42, whereafter each interconnection element 42 is structurally and electrically connected to a respective one of the terminals on the carrier substrate 32.

The thermal interface material 36 is subsequently placed on an upper surface of the microelectronic die 34. The thermal interface material 36 is made of a material that melts at a temperature that is much lower than the melting temperature of the wetting layer 14. There is preferably a difference of at least 1000° C. between the melting temperatures of the thermal interface material 36 and the wetting layer 14. The thermal interface material 36 preferably melts at a temperature below 200° C. In one embodiment, the thermal interface material 36 is made of pure indium.

The heat spreader component 10 is then placed over the microelectronic die 34 and the thermal interface material 36. An adhesive 44 is located between the sides 20 and the carrier substrate 32. Space is provided for the adhesive 44 between a respective side 20 and the carrier substrate 32 when the wetting layer 14 contacts the thermal interface material 36.

Figure 4:
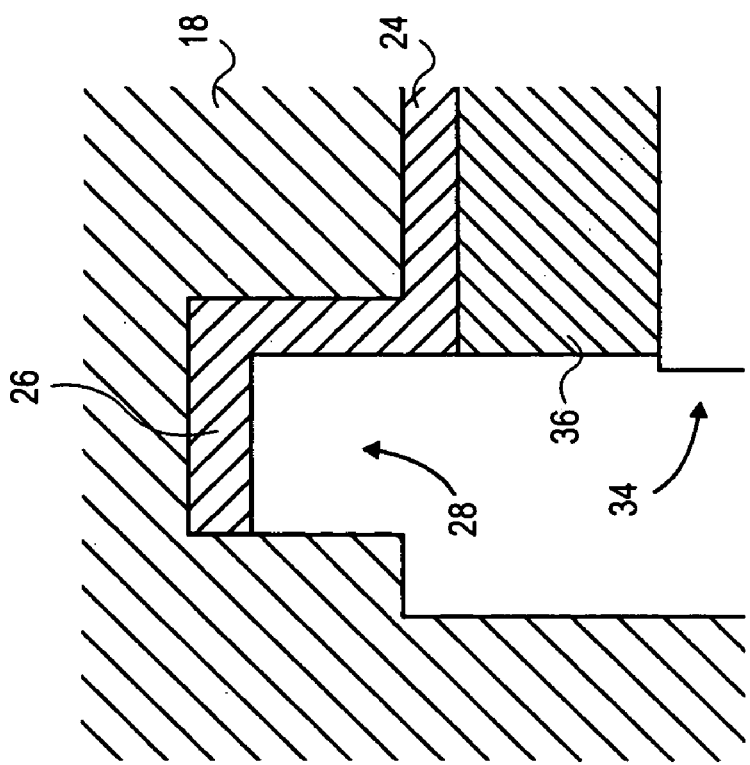
FIG. 4 is an enlarged view of a detail 4 in FIG. 3.

As more clearly illustrated in FIG. 4, each opening 28 is located next to the microelectronic die 34. The main portion 24 is located between the thermal interface material 36 and the central portion 18. The extension 26 has a first section that runs vertically into the opening 28 and a second section that covers a base of opening 28.

The entire assembly 30 as illustrated in FIGS. 2 and 3 is then inserted into a reflow oven. The reflow oven heats the assembly 30 to a temperature above the temperature at which the thermal interface material 36 melts, but below a temperature at which the interconnection elements 42 and other components of the assembly 30 melt.

Figure 5:
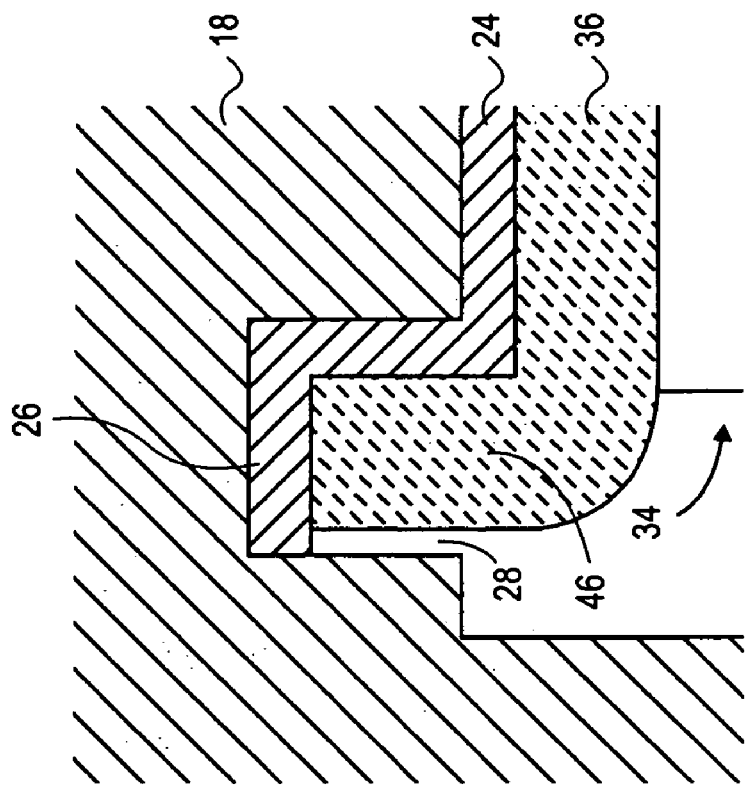
FIG. 5 is a view similar to FIG. 4 after a thermal interface material is reflowed and a portion thereof flows into an opening formed in a thermally conductive member of the heat spreader component.

FIG. 5 illustrates the components illustrated in FIG. 4 after the thermal interface material 36 has been melted. The central portion 18 moves down toward the microelectronic die 34. Due to a reduction in space between the microelectronic die 34 and the main portion 24, a portion 46 of the thermal interface material 36 squeezes out from between the microelectronic die 34 and the main portion 24. The portion 46 that is squeezed out is directed, due to surface tension, by the extension 26 into the opening 28. The extension 26 thus prevents excess portions of the thermal interface material 36 from coming into contact with unintended portions, for example where such a portion can cause a short circuit.

Figure 6:
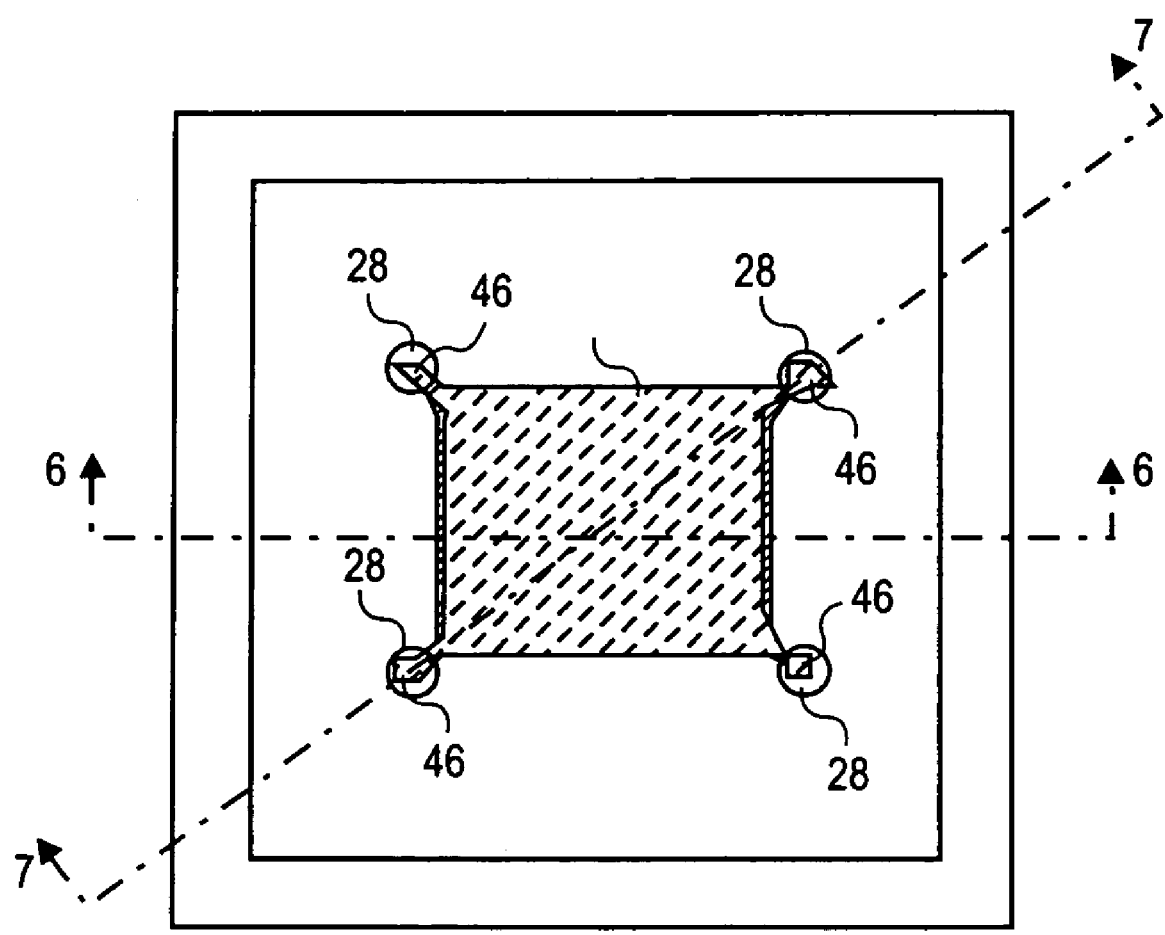

FIG. 6 illustrates where the thermal interface material 36 flows to when being squeezed out. As can be seen, the portions 46 of the thermal interface material 36 flow into respective ones of the openings 28. Substantially no portion of the thermal interface material 36 escapes, other than the four portions 46 that are channeled into the openings 28.

FIGS. 7 and 8 illustrate the microelectronic assembly 30 after having been allowed to cool so that the thermal interface material 36 has solidified. The sides 20 have dropped toward the carrier substrate 32, and the adhesive 44 is cured. Solidified portions 46 of the thermal interface material 36 are located within the openings 28.

In use, signals, power, and ground are provided between the carrier substrate 32 and the microelectronic die 34. The microelectronic die 34 generates heat when being operated. The central portion 18 is maintained at a lower temperature than the microelectronic die 34 so that the heat transfers through the thermal interface material 36 and the wetting layer 14 to the central portion 18. The heat then conducts or convects from the central portion 18.

Figure 9:
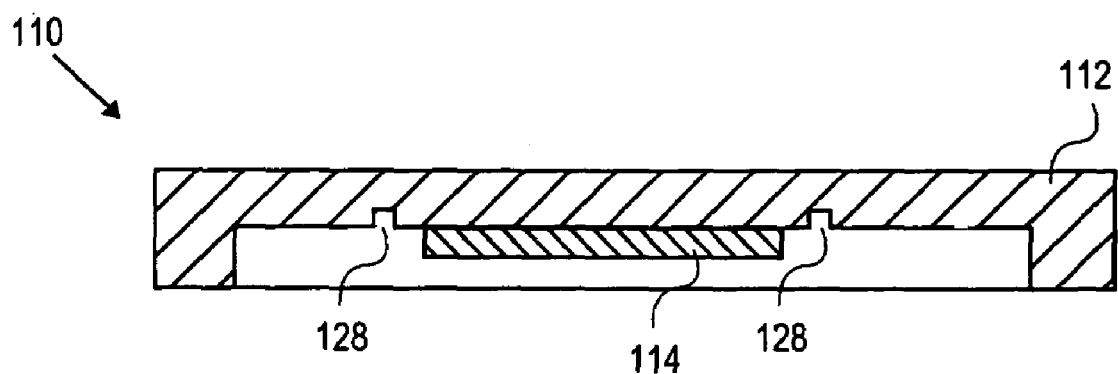
FIG. 9 is a cross-sectional view of a heat spreader component according to another embodiment of the invention.
Figure 10:
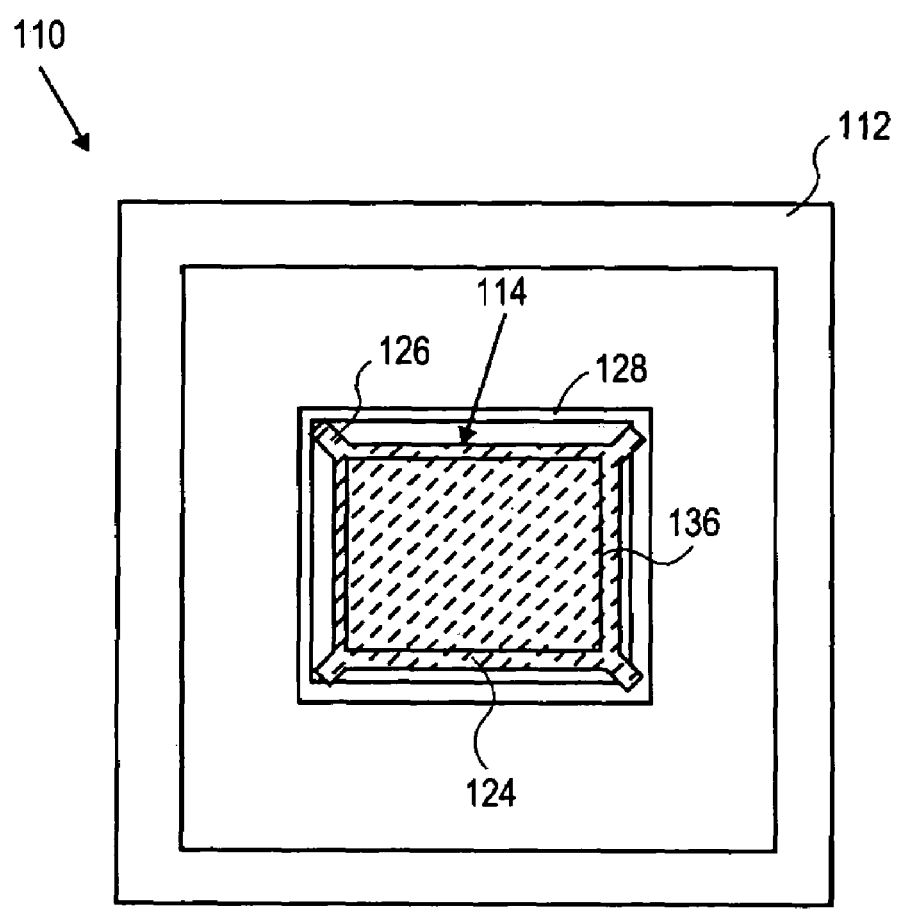
FIG. 10 is a bottom view of the heat spreader component of FIG. 9.

FIGS. 9 and 10 illustrate an alternative heat spreader component 110. As with the heat spreader component 10 of FIG. 1, the heat spreader component 110 of FIGS. 9 and 10 has a thermally conductive member 112 and a wetting layer 114 formed on a surface of the thermally conductive member 112. The thermally conductive member 12 of FIG. 1 has cavities in the form of the openings 28. The thermally conductive member 112 of FIG. 10 has a cavity in the form of a trench 128 formed entirely around a main portion 124 of the wetting layer 114. Extensions 126 of the wetting layer 114 connect the main portion 124 to the trench 128. Also illustrated in FIG. 10 is the location of a thermal interface material 136 in the entire assembly.

Figure 11:
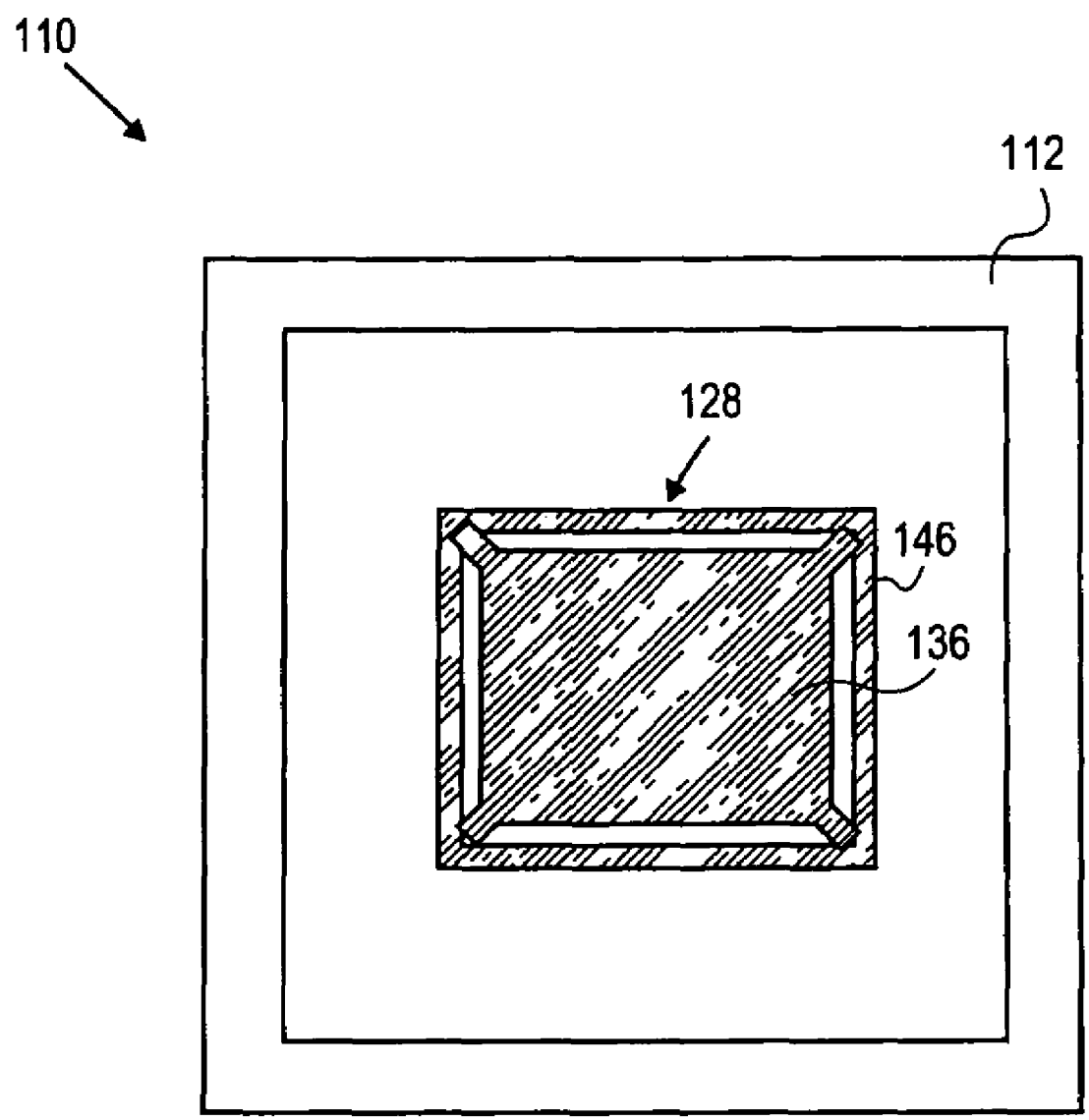
FIG. 11 is a view similar to FIG. 10 after a thermal interface material is heated so that it melts.

FIG. 11 illustrates how the thermal interface material 136 reflows when it is heated and melted. Portions 146 of the thermal interface material 136 flow along the extensions (126 in FIG. 10) into the trench 128. An advantage of having the trench 128 as opposed to the openings 28 of FIG. 1 is that the locations of the extensions 126 can be customized, and their number increased or reduced to tailor reflow of the thermal interface material 136.

Figure 12:
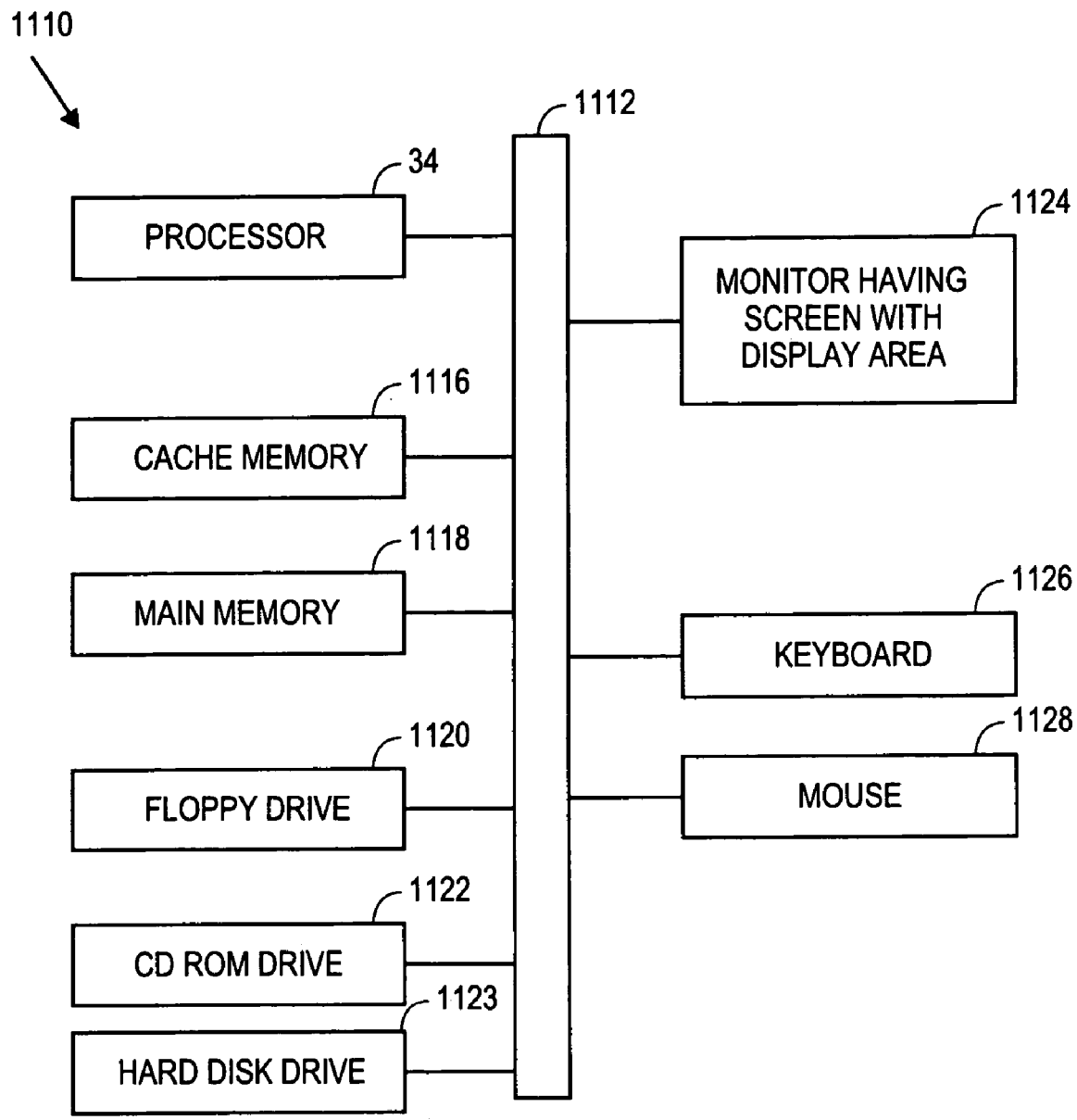
FIG. 12 is a block diagram of a computer system that may include the microelectronic assembly of, for example, FIG. 2.

FIG. 12 of the accompanying drawings illustrates further components of a computer system 1110. The computer system 1110 further includes a bus 1112 having connected thereto the microelectronic die 34 (hereinafter "processor 34"), cache memory 1116, main memory 1118, a floppy drive 1120, a compact disk read-only-memory (CD-ROM) drive 1122, a hard disk drive 1123, a monitor 1124 having a screen with a display area, a keyboard 1126, and a mouse 1128. A list of instructions in the form of a program can be stored on, for example, a compact disk and be loaded in the CD-ROM drive 1122. The instructions of the program can be loaded into the cache memory 1116 and the main memory 1118, while more of the instructions may reside on the compact disk and on the hard disk of the hard drive. The floppy drive 1120 or the hard disk drive 1123 may be used instead of the CD-ROM drive 1122 to load instructions into the computer system 1110. The instructions can be read by the processor 34 in a logical manner, which ensures proper execution of the program. A user may interact, utilizing the mouse 1128 or the keyboard 1126. A respective signal can be generated by the mouse 1128 or the keyboard 1126. The signal is sent through the bus 1112 and ultimately to the processor 34, which responds to the signal to modify an execution of the program. Execution of the program by the processor 34 results in control of how information stored in the main memory 1118, the cache memory 1116, the hard disk drive 1123, or the CD-ROM drive 1122 is displayed on the display area of the monitor 1124.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. A method of constructing a microelectronic assembly, comprising:

placing a thermally conductive member adjacent a microelectronic die with a thermal interface material between the microelectronic die and a wetting layer formed on a surface of the thermally conductive member, the surface of the thermally conductive member including a first opening, wherein in a cross-sectional side view of the microelectronic assembly, the thermally conductive member does not include the first opening, and in a cross-sectional view that is diagonal to the cross-sectional side view of the microelectronic assembly, the thermally conductive member includes the first opening;

heating the thermal interface material to cause reflow thereof, a first portion of the thermal interface material being directed by the wetting layer to an area outside the microelectronic die, wherein the area outside the microelectronic die is the first opening ; and allowing the thermal interface material to cool and solidify.

2. The method of claim 1, wherein the first opening is a first cavity, and wherein the wetting layer directs the first portion into the first cavity formed in the thermally conductive member.

3. The method of claim 2, wherein the first cavity is a first recess formed into the surface of the thermally conductive member on which the wetting layer is formed.

4. The method of claim 2, wherein the wetting layer has a main portion between the microelectronic die and the thermally conductive member, and a first extension not located between the microelectronic die and the thermally conductive member, the thermal interface material flowing along the first extension into the first cavity.

5. The method of claim 2, wherein a second portion of the thermal interface material is directed by the wetting layer into a second cavity in the thermally conductive member.

6. The method of claim 5, wherein the first and second cavities are first and second recesses formed into the surface of the thermally conductive member on which the wetting layer is formed.

7. The method of claim 5, wherein the wetting layer has a main portion between the microelectronic die and the thermally conductive member and first and second extensions not located between the microelectronic die and the thermally conductive member, the thermal interface material flowing along the extensions into the first and second cavities.

8. The method of claim 7, wherein the first and second extensions extend into the first and second cavities.

9. The method of claim 2, wherein the thermally conductive member includes nickel and the wetting layer is formed on the nickel.

10. The method of claim 9, wherein the wetting layer oxidizes more slowly than nickel.

11. The method of claim 2, wherein the wetting layer is at least one of gold and silver.

12. The method of claim 2, wherein the wetting layers melts above 1200° C.

13. The method of claim 2, wherein the wetting layer melts at a temperature which is at least 500° C. higher than a melting temperature of the thermal interface material.

14. The method of claim 2, wherein the wetting layer melts at a temperature which is at least 1000° C. higher than a melting temperature of the thermal interface material.

15. The method of claim 2, wherein the thermal interface material melts below 200° C.

16. The method of claim 2, wherein the thermal interface material at least includes indium.

17. The method of claim 2, wherein the wetting layer oxidizes more slowly than nickel, the wetting layer melts above 1200° C., and the thermal interface material melts below 200° C.

18. The method of claim 2, wherein the first cavity is located next to the microelectronic die.

19. The method of claim 2, wherein the first cavity is a trench formed at least partially around the microelectronic die.

* * * * *